(12) United States Patent
Hwang et al.

(10) Patent No.: US 8,957,443 B2
(45) Date of Patent: Feb. 17, 2015

(54) ORGANIC LIGHT-EMITTING DISPLAY APPARATUS AND METHOD OF MANUFACTURING THE SAME

(71) Applicant: Samsung Display Co. Ltd., Yongin-si, Gyeonggi-do (KR)

(72) Inventors: Kyu-Hwan Hwang, Yongin-si (KR); Seok-Gyu Yoon, Yongin-si (KR); Eung-Do Kim, Yongin-si (KR); Dong-Chan Kim, Yongin-si (KR); Bo-Ray Jung, Yongin-si (KR); Won-Jong Kim, Yongin-si (KR); Young-Woo Song, Yongin-si (KR); Jong-Hyuk Lee, Yongin-so (KR); Sung-Chul Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 44 days.

(21) Appl. No.: 13/712,933

(22) Filed: Dec. 12, 2012

(65) Prior Publication Data

US 2014/0014910 A1    Jan. 16, 2014

(30) Foreign Application Priority Data

Jul. 16, 2012  (KR) .................. 10-2012-0077366

(51) Int. Cl.

| | |
|---|---|
| *H01L 33/00* | (2010.01) |
| *H01L 21/00* | (2006.01) |
| *H01L 51/50* | (2006.01) |
| *H01L 51/56* | (2006.01) |
| *H01L 33/08* | (2010.01) |
| *H01L 51/52* | (2006.01) |
| *H01L 27/32* | (2006.01) |

(52) U.S. Cl.
CPC ............... *H01L 51/50* (2013.01); *H01L 51/56* (2013.01); *H01L 33/08* (2013.01); *H01L 51/5234* (2013.01); *H01L 51/5265* (2013.01); *H01L 27/3244* (2013.01); *H01L 2251/5315* (2013.01)
USPC ..................... 257/98; 257/E33.068; 438/29

(58) Field of Classification Search
None
See application file for complete search history.

(56) References Cited

U.S. PATENT DOCUMENTS

| | | | |
|---|---|---|---|
| 4,885,211 A | 12/1989 | Tang et al. | |
| 6,917,159 B2 | 7/2005 | Tyan et al. | |
| 2007/0222370 A1 | 9/2007 | Zhu et al. | |
| 2009/0021151 A1 | 1/2009 | Fukuda | |
| 2009/0051275 A1* | 2/2009 | Kobayashi et al. | 313/504 |
| 2010/0176389 A1 | 7/2010 | Chun et al. | |
| 2011/0198629 A1 | 8/2011 | Lee et al. | |

FOREIGN PATENT DOCUMENTS

| | | |
|---|---|---|
| JP | 2009-26574 A | 2/2009 |
| KR | 10-2010-0083362 | 7/2010 |
| KR | 10-2011-0093451 | 8/2011 |

* cited by examiner

*Primary Examiner* — Michael Lebentritt
*Assistant Examiner* — Kevin Quinto
(74) *Attorney, Agent, or Firm* — Christie, Parker & Hale, LLP

(57) ABSTRACT

An organic light-emitting display apparatus is provided. The organic light-emitting display apparatus includes: a pixel electrode for reflecting incident light and located on a substrate including a thin film transistor (TFT), and electrically connected to the TFT; an organic layer on the pixel electrode and including an emission layer; and an opposite electrode on the organic layer and including a resonant region for forming a resonant structure with the pixel electrode by reflecting light emitted from the emission layer, and a non-resonant region that is a region other than the resonant region.

16 Claims, 5 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims priority to and the benefit of Korean Patent Application No. 10-2012-0077366, filed on Jul. 16, 2012 in the Korean Intellectual Property Office, the entire content of which is incorporated herein by reference.

BACKGROUND

1. Field

Aspects of embodiments of the present invention relate to an organic light-emitting display apparatus and a method of manufacturing the organic light-emitting display apparatus.

2. Description of the Related Art

Organic light-emitting display apparatuses include an organic light-emitting device including a hole injection electrode, an electron injection electrode, and an organic emission layer formed between the hole injection electrode and the electron injection electrode. Organic light-emitting display apparatuses are self-emissive display apparatuses that generate light when excitons that are generated by combining holes injected from the hole injection electrode and electrons injected from the electron injection electrode in the organic emission layer drop to a ground state from an excited state.

Such an organic light-emitting display apparatus has a wide light emission wavelength. Accordingly, light-emitting efficiency and color purity thereof may be degraded. In addition, since light emitted from the organic emission layer has no directionality, many photons emitted in an arbitrary direction may not reach an actual viewer due to internal total reflection in an organic light-emitting device, thereby degrading light emission efficiency of the organic light-emitting device.

Accordingly, a microcavity structure may be applied to an organic light-emitting display apparatus. However, when the microcavity structure is applied to the organic light-emitting display apparatus, the brightness at side viewing angles of the organic light-emitting display apparatus may degrade and color shift may occur, even if the light-emitting efficiency thereof is improved.

SUMMARY

Embodiments of the present invention provide for an organic light-emitting display apparatus capable of reducing brightness reduction or variation according to a viewing angle, and of reducing color shift according to a viewing angle, while concurrently improving light-emitting efficiency. Further embodiments provide for a method of manufacturing the organic light-emitting display apparatus.

According to an exemplary embodiment of the present invention, an organic light-emitting display apparatus is provided. The organic light-emitting display apparatus includes: a pixel electrode for reflecting incident light and located on a substrate including a thin film transistor (TFT), and electrically connected to the TFT; an organic layer on the pixel electrode and including an emission layer; and an opposite electrode on the organic layer. The opposite electrode includes a resonant region for forming a resonant structure with the pixel electrode by reflecting light emitted from the emission layer, and a non-resonant region that is a region other than the resonant region.

A surface of the resonant region that faces the organic layer may have an area that is substantially a same as that of a surface of the non-resonant region that faces the organic layer.

A surface of the resonant region that faces the organic layer may have an area that is different from that of a surface of the non-resonant region that faces the organic layer.

The emission layer is configured to emit light having a wavelength corresponding to red light, green light, or blue light.

The organic layer may further include at least one of a hole injection layer or a hole transport layer between the pixel electrode and the emission layer, or an electron injection layer or an electron transport layer between the emission layer and the opposite electrode.

The light emitted from the emission layer may be output to the outside through the opposite electrode. The resonant region may include a semi-transparent layer. The non-resonant region may include a transparent layer.

A distance between the pixel electrode and the semi-transparent layer included in the resonant region may correspond to a wavelength of the light emitted from the emission layer.

The transparent layer may be shared by the resonant region and the non-resonant region. The semi-transparent layer may be only in the resonant region.

The transparent layer may include one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The semi-transparent layer may include a semi-transparent metal layer formed of one or more selected from the group consisting of Ag, Al, Mg, Li, Ca, Cu, LiF/Ca, LiF/Al, MgAg, and CaAg.

According to another exemplary embodiment of the present invention, a method of manufacturing an organic light-emitting display apparatus is provided. The method includes: forming a pixel electrode on a substrate including a thin film transistor (TFT), the pixel electrode being configured to reflect incident light, and electrically connected to the TFT; forming an organic layer including an emission layer on the pixel electrode; and forming an opposite electrode including a resonant region and a non-resonant region on the organic layer. The resonant region is configured to form a resonant structure with the pixel electrode by reflecting light emitted from the emission layer.

The forming of the opposite electrode may include forming a surface of the resonant region that faces the organic layer to have an area that is substantially a same as that of a surface of the non-resonant region that faces the organic layer.

The forming of the opposite electrode may include forming a surface of the resonant region that faces the organic layer to have an area that is different from that of a surface of the non-resonant region that faces the organic layer.

The forming of the opposite electrode may include forming a semi-transparent layer in the resonant region, and forming a transparent layer in the non-resonant region.

The forming of the opposite electrode may further include forming the transparent layer in the resonant region to cover the semi-transparent layer.

The forming of the opposite electrode may further include forming the transparent layer in the resonant region, and forming the semi-transparent layer on the transparent layer of the resonant region.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, embodiments of the present invention will be described in detail with reference to accompanying drawings. As used herein, the term "and/or" includes any and all combinations of one or more of the associated listed items. Expressions such as "at least one of," when preceding a list of elements, modify the entire list of elements and do not modify the individual elements of the list.

Figure 1:
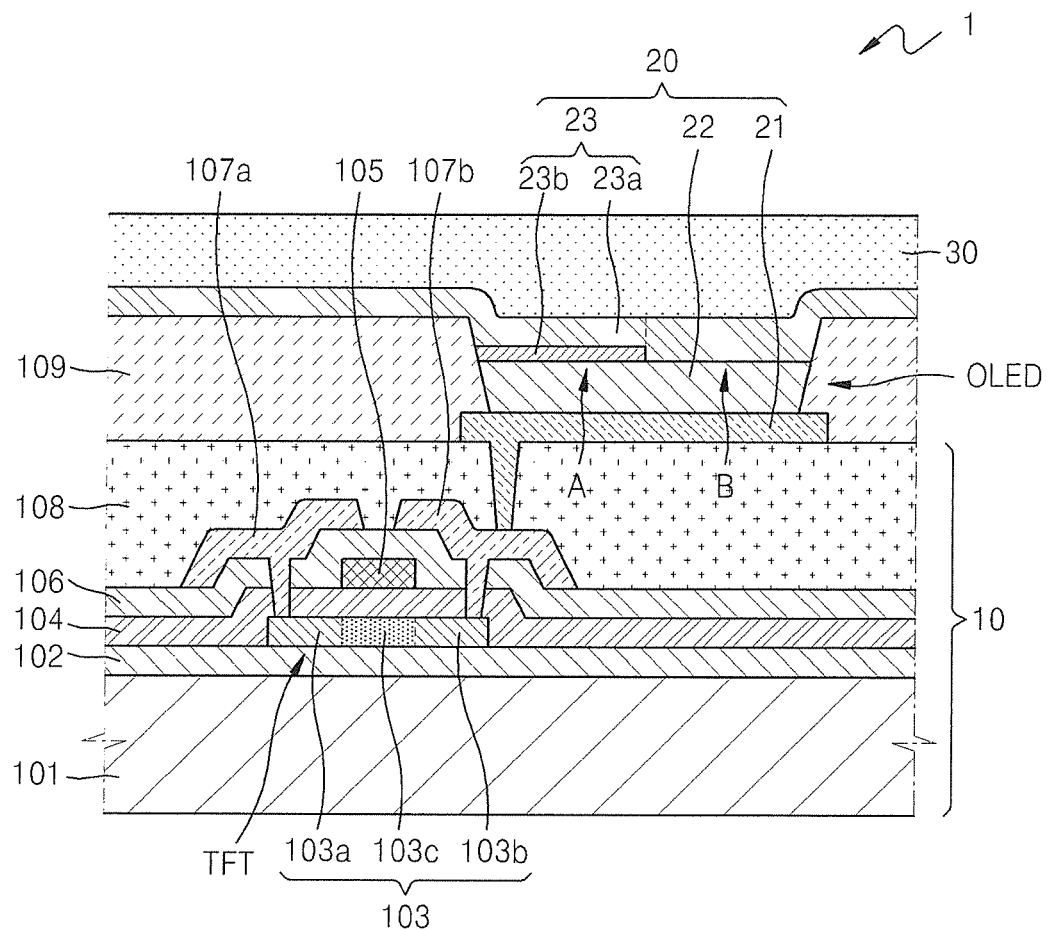
FIG. 1 is a schematic cross-sectional view of an organic light-emitting display apparatus according to an embodiment of the present invention.
Figure 2:
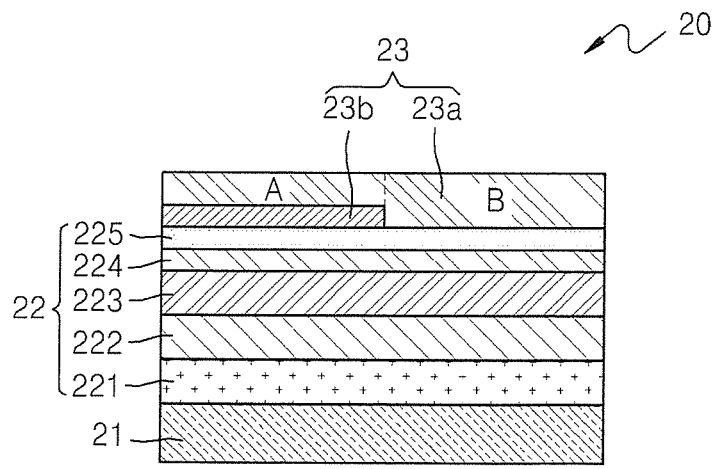
FIG. 2 is a schematic cross-sectional view of an organic light-emitting device (OLED) in the organic light-emitting display apparatus of FIG. 1.

FIG. 1 is a cross-sectional view of an organic light-emitting display apparatus 1 according to an embodiment of the present invention. FIG. 2 is a schematic cross-sectional view of an organic light-emitting device (OLED) 20 in the organic light-emitting display apparatus 1 of FIG. 1.

Referring to FIGS. 1 and 2, the organic light-emitting display apparatus 1 includes a pixel electrode 21 for reflecting incident light. The pixel electrode 21 is located on (or above) a substrate 10 including a thin film transistor (TFT), and electrically connected to the TFT. In addition, the organic light-emitting display apparatus 1 includes an organic layer 22 located on the pixel electrode 21 and including an emission layer 223, and an opposite electrode 23 located on the organic layer 22. The opposite electrode 23 includes a resonant region A for reflecting light emitted from the emission layer 223 and a non-resonant region B separate from (and adjacent to) the resonant region A. The resonant region A forms a resonant structure with the pixel electrode 21.

The substrate 10 includes a base substrate 101 and the TFT located on the base substrate 101. The substrate 10 may also include a capacitor located on the base substrate 101. The base substrate 101 may be formed of a glass material (such as a glass material mainly containing $SiO_2$), metal, or a plastic material. When the organic light-emitting display apparatus 1 is formed as a flexible display apparatus, the base substrate 101 may be formed of plastic having excellent heat resistance and durability, such as polyethylene terephthalate (PET), polyimide, polycarbonate, polyethylene naphthalate, polyarylate (PAR), or polyether imide.

A buffer layer 102 for preventing impurities from infiltrating the base substrate 101 and for planarizing the base substrate 101 is located on the base substrate 101. The TFT is located on the buffer layer 102 and includes an active layer 103, a gate electrode 105, a source electrode 107a, and a drain electrode 107b.

The active layer 103 may be formed of a semiconductor material such as amorphous silicon or polysilicon. However, the active layer 103 is not limited thereto and, in other embodiments, may be formed of an oxide semiconductor. The active layer 103 includes a source region 103a and a drain region 103b doped with ion impurities on outer portions of a channel region 103c.

The gate electrode 105 is located on the active layer 103. A gate insulating layer 104 is located between the active layer 103 and the gate electrode 105. The gate electrode 105 may include one or more selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), to have a single- or multi-layered structure.

An interlayer dielectric 106 is located on the gate electrode 105. The source and drain electrodes 107a and 107b are respectively connected to the source region 103a and the drain region 103b of the active layer 103. The interlayer dielectric 106 is between upper portions of the source and drain electrodes 107a and 107b (on one side of the interlayer dielectric 106), and the source and drain regions 103a and 103b (on the other side of the interlayer dielectric 106). The source and drain electrodes 107a and 107b may include one or more metal materials selected from the group consisting of Al, Pt, Pd, Ag, Mg, Au, Ni, Nd, Ir, Cr, Li, Ca, Mo, Ti, W, and Cu, to have a single- or multi-layered structure.

A planarization layer 108 that has a via-hole through which the drain electrode 107b is electrically connected to the pixel electrode 21 is located on the source and the drain electrodes 107a and 107b. In other embodiments, the source electrode 107a, rather than the drain electrode 107b, is electrically connected to the pixel electrode 21 through the via-hole.

The OLED 20 is located on the substrate 10. The OLED 20 includes the pixel electrode 21, the organic layer 22 located on the pixel electrode 21, and the opposite electrode 23 located on the organic layer 22.

In the embodiment of FIG. 1, the pixel electrode 21 is an anode and the opposite electrode 23 is a cathode. In other embodiments, the pixel electrode 21 is a cathode and the opposite electrode 23 is a cathode. When a voltage is applied to the pixel electrode 21 and the opposite electrode 23, holes and electrons are injected into the emission layer 223 included in the organic layer 22 from the pixel electrode 21 and the opposite electrode 23, respectively. In addition, excitons formed by combining the injected holes and electrons drop to a ground state from an excited state to emit light.

According to the embodiment of FIG. 1, the OLED 20 is located on the substrate 10 including the TFT. However, the present invention is not limited thereto. For example, in other embodiments, the pixel electrode 21 of the OLED 20 is formed at the same level (e.g., in the same layer) as the active layer 103 of the TFT, the gate electrode 105 of the TFT, or the source and drain electrodes 107a and 107b of the TFT.

Although the gate electrode 105 of the TFT is located on or above the active layer 103 in FIG. 1, the present invention is not limited thereto. For example, in other embodiments, the gate electrode 105 is located under or below the active layer 103.

The pixel electrode 21 is formed as a reflective electrode that is electrically connected to the TFT included on the substrate 10, and reflects light emitted from the emission layer 223. The pixel electrode 21 may include a reflective layer formed of Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 23 faces the pixel electrode 21. The opposite electrode 23 includes (a) the resonant region A for forming a resonant structure with the pixel electrode 21 by reflecting the light emitted from the emission layer 223, and (b) the non-resonant region B that is a region other than the resonant region A. The light emitted from the emission layer 223 is emitted to the outside through the opposite electrode 23. The resonant region A includes a semi-transparent layer 23b. The non-resonant region B includes a transparent layer 23a.

In addition, the resonant region A and the non-resonant region B include surfaces facing the organic layer 22, areas of which are the same (or substantially the same) as each other. This provides a good balance of improved light-emitting efficiency and improved viewing angle characteristics, as described below. The transparent layer 23a is shared by the resonant region A and the non-resonant region B. The semi-transparent layer 23b is located under the transparent layer 23a corresponding to the resonant region A. The transparent layer 23a may include at least one or more selected from the group consisting of ITO, IZO, ZnO, $In_2O_3$, IGO, and AZO. The semi-transparent layer 23b may include at least one or more semi-transparent metal layers selected from the group consisting of Ag, Al, Mg, Li, Ca, Cu, LiF/Ca, LiF/Al, MgAg, and CaAg.

According to the above structure, the light emitted from the emission layer 223 is output to the outside through different mechanisms in the resonant region A and the non-resonant region B. That is, in the non-resonant region B, the light emitted from the emission layer 223 is directly output through the opposite electrode 23 only including the transparent layer 23a and without resonance. However, in the resonant region A, since the opposite electrode 23 includes the semi-transparent layer 23b, the light emitted from the emission layer 223 resonates by reciprocating between the opposite electrode 23 (including the semi-transparent layer 23b) and the pixel electrode 21 formed as the reflective electrode.

That is, the intensity of the light emitted from the emission layer 223 may be amplified by reciprocating between the pixel electrode 21 and the opposite electrode 23 by adjusting a distance between the pixel electrode 21 and the semi-transparent layer 23b included in the opposite electrode 23 to satisfy a constructive interference condition of a wavelength of the emitted light. The amplified light is emitted to the outside through the opposite electrode 23. Light-emitting efficiency may be improved by using this microcavity structure.

By contrast, in a comparative organic light-emitting display apparatus, where the entire opposite electrode 23 is configured to form the resonant structure with the pixel electrode 21 in order to improve the light-emitting efficiency, a wavelength of the light emitted from a front surface of the organic light-emitting display apparatus 1 and a wavelength of the light emitted from sides of the organic light-emitting display apparatus 1 differ from each other. This is due to a difference between optical paths in the resonant structure. That is, color shift and brightness degradation or variation at side viewing angles may occur. In addition, in a comparative organic light-emitting display apparatus where the entire opposite electrode 23 is formed to have the transparent layer only, the color shift may not occur. However, the light-emitting efficiency of the organic light-emitting display apparatus may be greatly degraded.

According to the organic light-emitting display apparatus 1 of the embodiment of FIG. 1, since the opposite electrode 23 is configured to include the resonant region A and the non-resonant region B, the light emitted directly from the non-resonant region B and the amplified light emitted from the resonant region A in one sub-pixel mix, and accordingly, both the light-emitting efficiency and the viewing angle characteristics are improved concurrently.

The organic layer 22 is located in a space defined by a pixel-defining layer 109 between the pixel electrode 21 and the opposite electrode 23. The organic layer 22 includes the emission layer 223. The emission layer 223 may be formed of a low-molecular weight organic material or a high-molecular weight organic material, and may emit light having a wavelength corresponding to one of red (R), green (G), or blue (B) light. The organic layer 22 may include, in addition to the emission layer 223, at least one intermediate layer from among a hole injection layer (HIL) 221 or a hole transport layer (HTL) 222 (located between the pixel electrode 21 and the emission layer 223), or an electron transport layer (ETL) 224 or an electron injection layer (EIL) 225 (located between the emission layer 223 and the opposite electrode 23).

The distance between the pixel electrode 21 and the semi-transparent layer 23b included in the resonant region A can be varied (depending on, for example, a wavelength of the light emitted from the emission layer 223) by adjusting a thickness of the emission layer 223 and/or the at least one intermediate layer 221, 222, 224, or 225 included in the organic layer 22 (to thereby satisfy, for example, constructive interference conditions according to a certain wavelength). The light emitted from the emission layer 223 is emitted toward the opposite electrode 23 directly or by being reflected by the pixel electrode 21 formed as the reflective electrode.

An encapsulation unit 30 for preventing external moisture and/or oxygen from infiltrating the OLED 20 is located on the opposite electrode 23. The encapsulation unit 30 may be formed of an encapsulation substrate including a thin film encapsulation (TFE)—in which an inorganic film and an organic film are alternately layered—and glass, or a metal sheet. For example, when the organic light-emitting display apparatus 1 is formed as a flexible display apparatus, the encapsulation unit 30 may be formed as a TFE.

Figure 3:
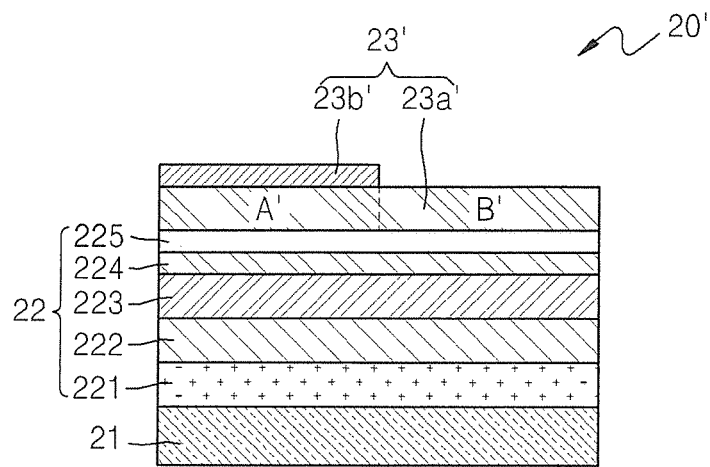
FIG. 3 is a schematic cross-sectional view of an OLED according to another embodiment of the present invention.

FIG. 3 is a cross-sectional view of an OLED 20' according to another embodiment of the present invention.

Referring to FIG. 3, the OLED 20' has the same (or substantially the same) structure as the OLED 20 shown in FIG. 2, except for an opposite electrode 23'. The opposite electrode 23' includes (a) a resonant region A' including a semi-transparent layer 23b', and (b) a non-resonant region B' including a transparent layer 23a'. Light emitted from the emission layer 223 is output to the outside through the opposite electrode 23'.

In addition, surfaces of the resonant region A' and the non-resonant region B' that face the organic layer 22 have the same (or substantially the same) areas as each other. The transparent layer 23a' is shared by the resonant region A' and the non-resonant region B'. The semi-transparent layer 23b' is located on the transparent layer 23a' corresponding to the resonant region A'. Other configurations and effects of the OLED 20' are the same as or similar to those of the OLED 20 of FIG. 2.

Figure 4:
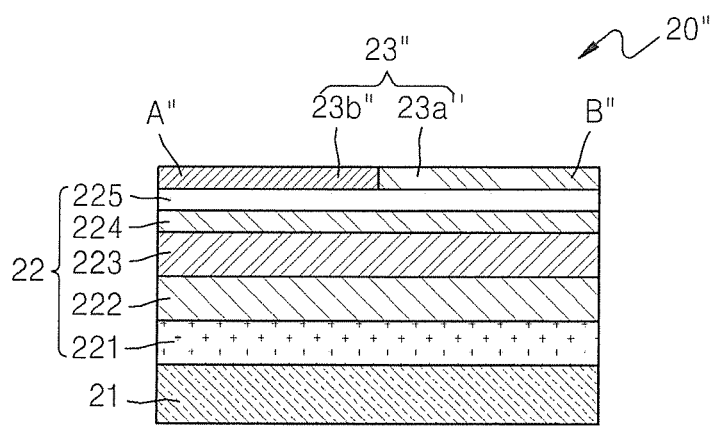
FIG. 4 is a schematic cross-sectional view of an OLED according to another embodiment of the present invention.

FIG. 4 is a schematic cross-sectional view of an OLED 20" according to another embodiment of the present invention.

Referring to FIG. 4, the OLED 20" has the same (or substantially the same) configuration as that of the OLED 20 of FIG. 2, except for an opposite electrode 23". The opposite electrode 23" includes (a) a resonant region A" including a semi-transparent layer 23b", and (b) a non-resonant region B" including a transparent layer 23a". Light emitted from the emission layer 223 is output to the outside through the opposite electrode 23".

In addition, surfaces of the resonant region A" and the non-resonant region B" that face the organic layer 22 have the same (or substantially the same) areas as each other. The transparent layer 23a" is only located in the non-resonant region B". The semi-transparent layer 23b" is only located in the resonant region A". Other configurations and effects of the OLED 20" are the same as or similar to those of the OLED 20 of FIG. 2.

Figure 5:
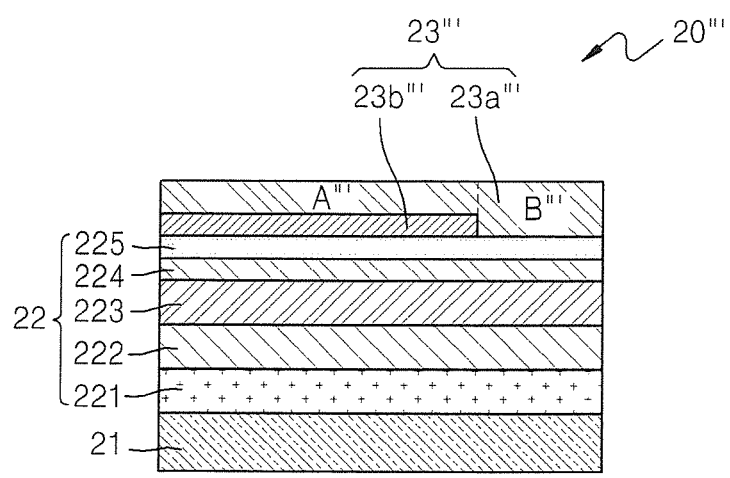
FIG. 5 is a schematic cross-sectional view of an OLED according to another embodiment of the present invention.

FIG. 5 is a schematic cross-sectional view of an OLED 20''' according to another embodiment of the present invention.

Referring to FIG. 5, the OLED 20''' has the same (or substantially the same) configuration as that of the OLED 20 of FIG. 2, except for an opposite electrode 23'''.

The opposite electrode 23''' includes (a) a resonant region A''' including a semi-transparent layer 23b", and (b) a non-resonant region B''' including a transparent layer 23a". Light emitted from the emission layer 223 is output to the outside through the opposite electrode 23". The transparent layer 23a''' is shared by the resonant region A''' and the non-resonant region B'''. The semi-transparent layer 23b" is located under the transparent layer 23a''' corresponding to the resonant region A'''.

Surfaces of the resonant region A''' and the non-resonant region B''' in the opposite electrode 23''' that face the organic layer 22 have different areas from each other. For example, by forming the resonant region A''' to be larger than the non-resonant region B''', light-emitting efficiency may be further improved. On the other hand, by forming the non-resonant region B''' to be larger than the resonant region A''', a viewing angle characteristic may be further improved.

Figure 6A:
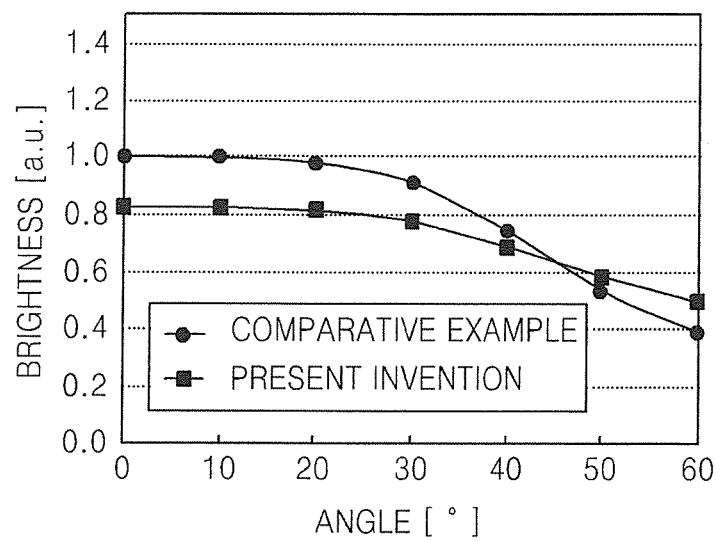
FIGS. 6A and 6B are graphs showing results of improving brightness reduction or variation, and of improving color shift in the organic light-emitting display apparatus of FIG. 1.
Figure 6B:
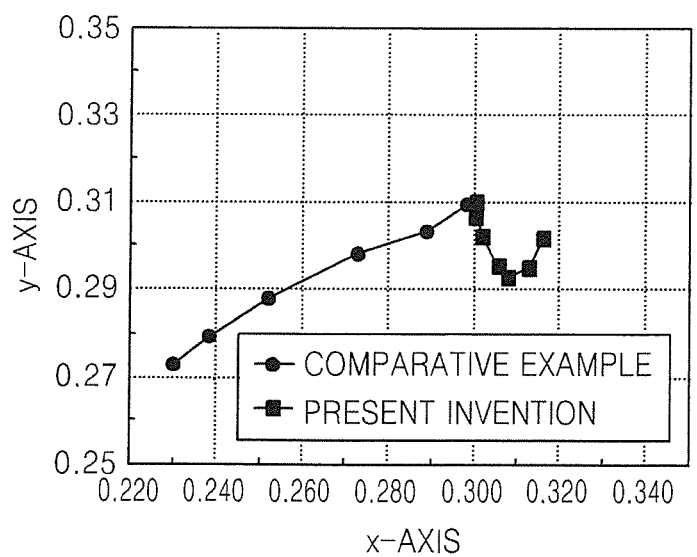

FIGS. 6A and 6B are graphs showing results of improving brightness reduction or variation, and of improving color shift in the organic light-emitting display apparatus 1 of FIG. 1. An organic light-emitting display apparatus in which an entire region of an opposite electrode is configured to form a resonant region is used as a comparative example.

Referring to FIG. 6A, the brightness at a front surface (that is, at 0°) of the organic light-emitting apparatus of the comparative example is normalized at 1.0. Accordingly, the brightness variation according to a side viewing angle (°) in the organic light-emitting display apparatus 1 of FIG. 1 and in the comparative example are shown. From the graph of FIG. 6A, although a brightness value at the front surface (0°) of the organic light-emitting display apparatus 1 of FIG. 1 is less than a brightness value in the comparative example, brightness variation between the front and sides is less than that of the comparative example.

Referring to FIG. 6B, the x-axis represents a color coordinate value according to an x coordinate, and the y-axis represents a color coordinate value according to a y coordinate. Seven points denote viewing angles of 0°, 10°, 20°, 30°, 40°, 50°, and 60° from a left side. According to the graph of FIG. 6B, a variation of the color coordinate values according to an increase in the viewing angle of the organic light-emitting display apparatus 1 is significantly less than that of the comparative example.

According to the graphs of FIGS. 6A and 6B, the viewing angle characteristics of the organic light-emitting display apparatus 1 (that is, the brightness reduction or variation, and the color shift), are improved when compared to those of the comparative example. In addition, since the organic light-emitting display apparatus 1 includes both the resonant region A and the non-resonant region B, the viewing angle characteristics, as well as the light-emitting efficiency, are improved concurrently.

Hereinafter, a method of manufacturing the organic light-emitting display apparatus 1 will be described with reference to FIGS. 7 through 11.

FIGS. 7 through 11 are cross-sectional views sequentially illustrating a method of manufacturing the organic light-emitting display apparatus 1 of FIG. 1, according to an embodiment of the present invention.

Figure 7:
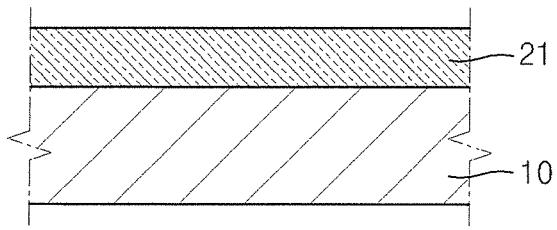
FIGS. 7 through 11 are cross-sectional views sequentially illustrating a method of manufacturing the organic light-emitting display apparatus of FIG. 1, according to an embodiment of the present invention.

Referring to FIG. 7 and to FIG. 1, a substrate 10 including a TFT is formed or fabricated. The pixel electrode 21 is formed on the substrate 10. The substrate 10 may include, for example, a base substrate 101, the TFT, and a capacitor. The pixel electrode 21 is electrically connected to the TFT and is formed as a reflective electrode. The pixel electrode 21 may include a reflective layer formed of Ag, Mg, Al, Pt, Pd, Au, Ni, Nd, Ir, Cr, or a compound thereof, and a transparent or semi-transparent electrode layer formed on the reflective layer.

Figure 8:
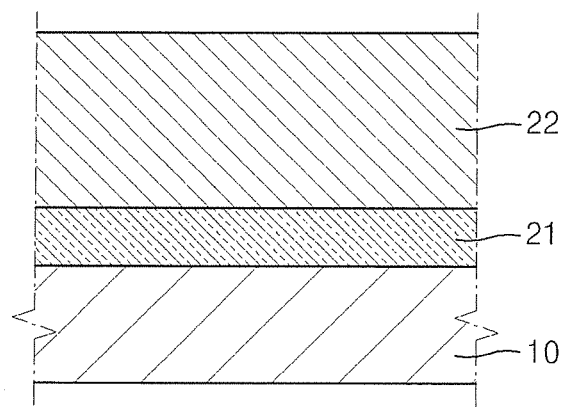

Referring to FIG. 8, the organic layer 22 is formed on the pixel electrode 21. Referring also to FIG. 2, the organic layer 22 may include, for example, the emission layer 223 for emitting light having a wavelength corresponding to a wavelength of at least one of R, G, or B light, and at least one intermediate layer from among the HIL 221, the HTL 222, the ETL 224, and the EIL 225. The organic layer 22 may be formed in various ways such as vapor deposition, thermal transfer, or printing. In addition, the thicknesses of the emission layer 223 and/or the intermediate layers 221, 222, 224, and 225 can be varied to satisfy resonant conditions according to a wavelength of the light emitted from the emission layer 223.

Figure 9:
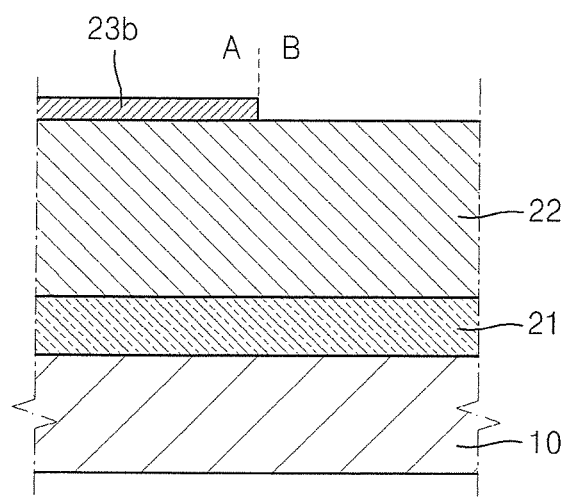

Referring to FIG. 9, the semi-transparent layer 23b is formed on the organic layer 22 in a region corresponding to the resonant region A. The semi-transparent layer 23b may include a semi-transparent metal layer formed of one or more selected from the group consisting of Ag, Al, Mg, Li, Ca, Cu, LiF/Ca, LiF/Al, MgAg, and CaAg. In FIG. 9, the semi-transparent layer 23b is formed so that an area of the non-resonant region A that faces the organic layer 22 is half (or substantially half) of the entire area of the exposed organic layer 22.

Figure 10:
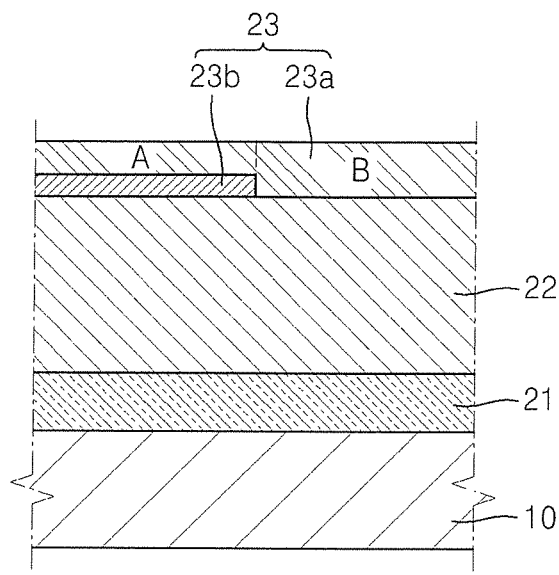

Referring to FIG. 10, the transparent layer 23a is formed on the organic layer 22 in the region corresponding to the resonant region A and the non-resonant region B to cover the semi-transparent layer 23b. The transparent layer 23a may include one or more selected from the group consisting of ITO, IZO, ZnO, In$_2$O$_3$, IGO, and AZO. According to the above configurations, the opposite electrode 23 includes (i) the non-resonant region B only including the transparent layer 23a, and (ii) the resonant region A including the transparent layer 23a and the semi-transparent layer 23b. The light emitted from the emission layer 223 included in the organic layer 22 is output to the outside through the opposite electrode 23. Since the opposite electrode 23 includes both the resonant region A and the non-resonant region B, the light-emitting efficiency and the viewing angle characteristics are improved concurrently, which is an effect described above with reference to FIGS. 1 and 2. Accordingly, detailed descriptions thereof are not repeated.

Figure 11:
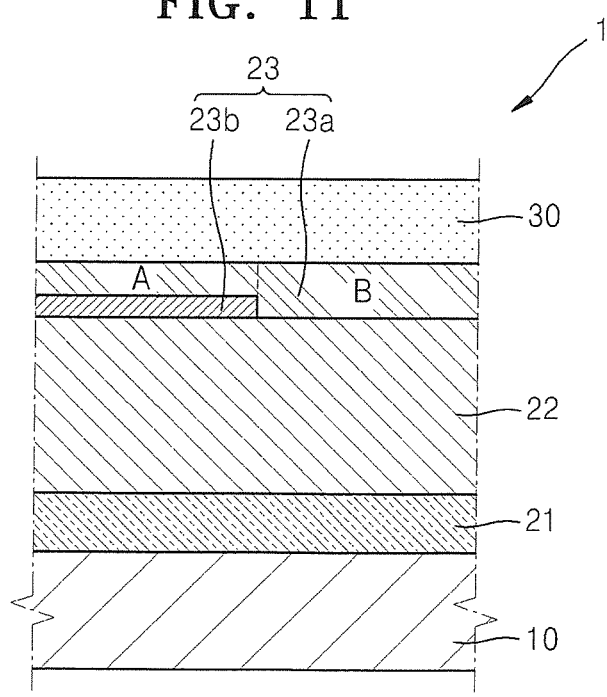

Referring to FIG. 11, the encapsulation unit 30 for preventing the external moisture and/or oxygen from infiltrating the OLED 20 is formed on the opposite electrode 23. The encapsulation unit 30 may be an encapsulation substrate including TFE (in which an inorganic film and an organic film are alternately stacked), and glass, or a metal sheet.

FIGS. 7 through 11 illustrate a method of manufacturing the organic light-emitting display apparatus 1 of FIG. 1. However, the present invention is not limited thereto. In other embodiments, for example, some of the steps may vary.

For example, in an exemplary embodiment of fabricating the OLED 20' of FIG. 3, the transparent layer 23a' is formed on a region of the organic layer 22 corresponding to the entire resonant region A' and the non-resonant region B'. In addition, the semi-transparent layer 23b' is formed only on a region of the transparent layer 23a' that corresponds to the resonant region A'.

Further, in an exemplary embodiment of manufacturing the OLED 20'' of FIG. 4, the semi-transparent layer 23b'' is only formed on the organic layer 22 in the region corresponding to the resonant region A''. In addition, the transparent layer 23a'' is only formed on the organic layer 22 in the region corresponding to the non-resonant region B''.

Finally, in an exemplary embodiment of manufacturing the OLED 20''' of FIG. 5, the semi-transparent layer 23b''' is formed on the organic layer 22 in the region corresponding to the resonant region A'''. In addition, the transparent layer 23a''' is formed on the organic layer 22 in the region corresponding to the resonant region A''' and the non-resonant region B''' to cover the semi-transparent layer 23b'''. Here, the semi-transparent layer 23b''' is formed so that a surface area of the resonant region A''' facing the organic layer 22 is greater than half of the entire area of the exposed organic layer 22 (i.e., the resonant regions A''' has a larger surface area facing the organic layer 22 than the non-resonant region B''').

In another embodiment of the present invention, the semi-transparent layer is formed so that the surface area of the resonant region facing the organic layer is less than half of the entire area of the exposed organic layer (i.e., the resonant region has a smaller surface area facing the organic layer than the non-resonant region).

According to an organic light-emitting display apparatus and a method of manufacturing the organic light-emitting display apparatus of exemplary embodiments of the present invention, a sub-pixel includes both a resonant structure and a non-resonant structure. Accordingly, brightness reduction or variation according to the viewing angle, and color shift according to the viewing angle may be reduced. At the same time, light-emitting efficiency may be increased.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
    a pixel electrode for reflecting incident light and located on a substrate comprising a thin film transistor (TFT), and electrically connected to the TFT;
    an organic layer on the pixel electrode and comprising an emission layer; and
    an opposite electrode on the organic layer and comprising:
        a resonant region for forming a resonant structure with the pixel electrode by reflecting light emitted from the emission layer; and
        a non-resonant region for transmitting the light emitted from the emission layer and not forming any resonant structure with respect to the light emitted from the emission layer.

2. The organic light-emitting display apparatus of claim 1, wherein a surface of the resonant region that faces the organic layer has an area that is substantially a same as that of a surface of the non-resonant region that faces the organic layer.

3. The organic light-emitting display apparatus of claim 1, wherein a surface of the resonant region that faces the organic layer has an area that is different from that of a surface of the non-resonant region that faces the organic layer.

4. The organic light-emitting display apparatus of claim 1, wherein the emission layer is configured to emit light having a wavelength corresponding to red light, green light, or blue light.

5. The organic light-emitting display apparatus of claim 4, wherein the organic layer further comprises at least one of a hole injection layer or a hole transport layer between the pixel electrode and the emission layer, or an electron injection layer or an electron transport layer between the emission layer and the opposite electrode.

6. The organic light-emitting display apparatus of claim 1, wherein
    the light emitted from the emission layer is output to the outside through the opposite electrode,
    the resonant region comprises a semi-transparent layer, and
    the non-resonant region comprises a transparent layer.

7. The organic light-emitting display apparatus of claim 6, wherein a distance between the pixel electrode and the semi-transparent layer included in the resonant region corresponds to a wavelength of the light emitted from the emission layer.

8. The organic light-emitting display apparatus of claim 6, wherein
    the transparent layer is shared by the resonant region and the non-resonant region, and
    the semi-transparent layer is only in the resonant region.

9. The organic light-emitting display apparatus of claim 6, wherein the transparent layer comprises one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

10. The organic light-emitting display apparatus of claim 6, wherein the semi-transparent layer comprises a semi-transparent metal layer formed of one or more selected from the group consisting of Ag, Al, Mg, Li, Ca, Cu, LiF/Ca, LiF/Al, MgAg, and CaAg.

11. A method of manufacturing an organic light-emitting display apparatus, the method comprising:
    forming a pixel electrode on a substrate comprising a thin film transistor (TFT), the pixel electrode being configured to reflect incident light, and electrically connected to the TFT;
    forming an organic layer comprising an emission layer on the pixel electrode; and
    forming an opposite electrode comprising a resonant region and a non-resonant region on the organic layer, the resonant region being configured to form a resonant structure with the pixel electrode by reflecting light emitted from the emission layer, the non-resonant region being configured to transmit the light emitted from the emission layer and not form any resonant structure with respect to the light emitted from the emission layer.

12. The method of claim 11, wherein the forming of the opposite electrode comprises forming a surface of the resonant region that faces the organic layer to have an area that is substantially a same as that of a surface of the non-resonant region that faces the organic layer.

13. The method of claim 11, wherein the forming of the opposite electrode comprises forming a surface of the resonant region that faces the organic layer to have an area that is different from that of a surface of the non-resonant region that faces the organic layer.

14. The Method of claim 11, wherein the forming of the opposite electrode comprises:
  forming a semi-transparent layer in the resonant region; and
  forming a transparent layer in the non-resonant region.

15. The method of claim 14, wherein the forming of the opposite electrode further comprises forming the transparent layer in the resonant region to cover the semi-transparent layer.

16. The method of claim 14, wherein the forming of the opposite electrode further comprises:
  forming the transparent layer in the resonant region; and
  forming the semi-transparent layer on the transparent layer of the resonant region.

* * * * *